(12) United States Patent
Hsu et al.

(10) Patent No.: US 8,698,217 B2
(45) Date of Patent: Apr. 15, 2014

(54) METAL SHIELD STRUCTURES IN BACKSIDE ILLUMINATION IMAGE SENSOR CHIPS

(75) Inventors: Chun-Yuan Hsu, Kaohsiung (TW);
Kun-Ei Chen, Beimen Township (TW);
Huai-Tei Yang, Hsin-Chu (TW);
Chien-Chung Chen, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 50 days.

(21) Appl. No.: 13/428,904

(22) Filed: Mar. 23, 2012

(65) Prior Publication Data

US 2013/0249039 A1    Sep. 26, 2013

(51) Int. Cl.
*H01L 31/062* (2012.01)

(52) U.S. Cl.
USPC ..... 257/292; 257/293; 257/233; 257/E27.084

(58) Field of Classification Search
USPC ........... 257/292–294, 431–432, 435, 459.738
See application file for complete search history.

(56) References Cited

U.S. PATENT DOCUMENTS

| 7,935,994 B2 * | 5/2011 | Wang et al. .................... 257/292 |
| 2010/0230729 A1 * | 9/2010 | Ellis-Monaghan et al. .. 257/228 |
| 2012/0242874 A1 * | 9/2012 | Noudo .......................... 348/294 |

* cited by examiner

*Primary Examiner* — Dung A. Le
(74) *Attorney, Agent, or Firm* — Slater & Matsil, L.L.P.

(57) ABSTRACT

A device includes a semiconductor substrate having a front side and a backside. An active image sensor pixel array is disposed on the front side of the semiconductor substrate. A metal shield is disposed on the backside of, and overlying, the semiconductor substrate. The metal shield has an edge facing the active image sensor pixel array. The metal shield has a middle width, and a top width greater than the middle width.

20 Claims, 9 Drawing Sheets

METAL SHIELD STRUCTURES IN BACKSIDE ILLUMINATION IMAGE SENSOR CHIPS

BACKGROUND

Backside Illumination (BSI) image sensor chips are replacing front-side illumination sensor chips for their higher efficiency in capturing photons. In the formation of the BSI image sensor chips, image sensors, such as photo diodes, and logic circuits are formed on a silicon substrate of a wafer, followed by the formation of an interconnect structure on a front side of the silicon chip.

The image sensors in the BSI image sensor chips generate electrical signals in response to the stimulation of photons. The magnitudes of the electrical signals (such as the currents) depend on the intensity of the incident light received by the respective image sensors. To achieve increased quantum efficiency of image sensors, it is desirable that more light is received by the image sensors.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A metal shield structure in a Backside Illumination (BSI) image sensor chip and the methods of forming the same are provided in accordance with various exemplary embodiments. The intermediate stages of forming the metal shield structure are illustrated. The variations of the embodiments are discussed. Throughout the various views and illustrative embodiments, like reference numbers are used to designate like elements.

Figure 1:
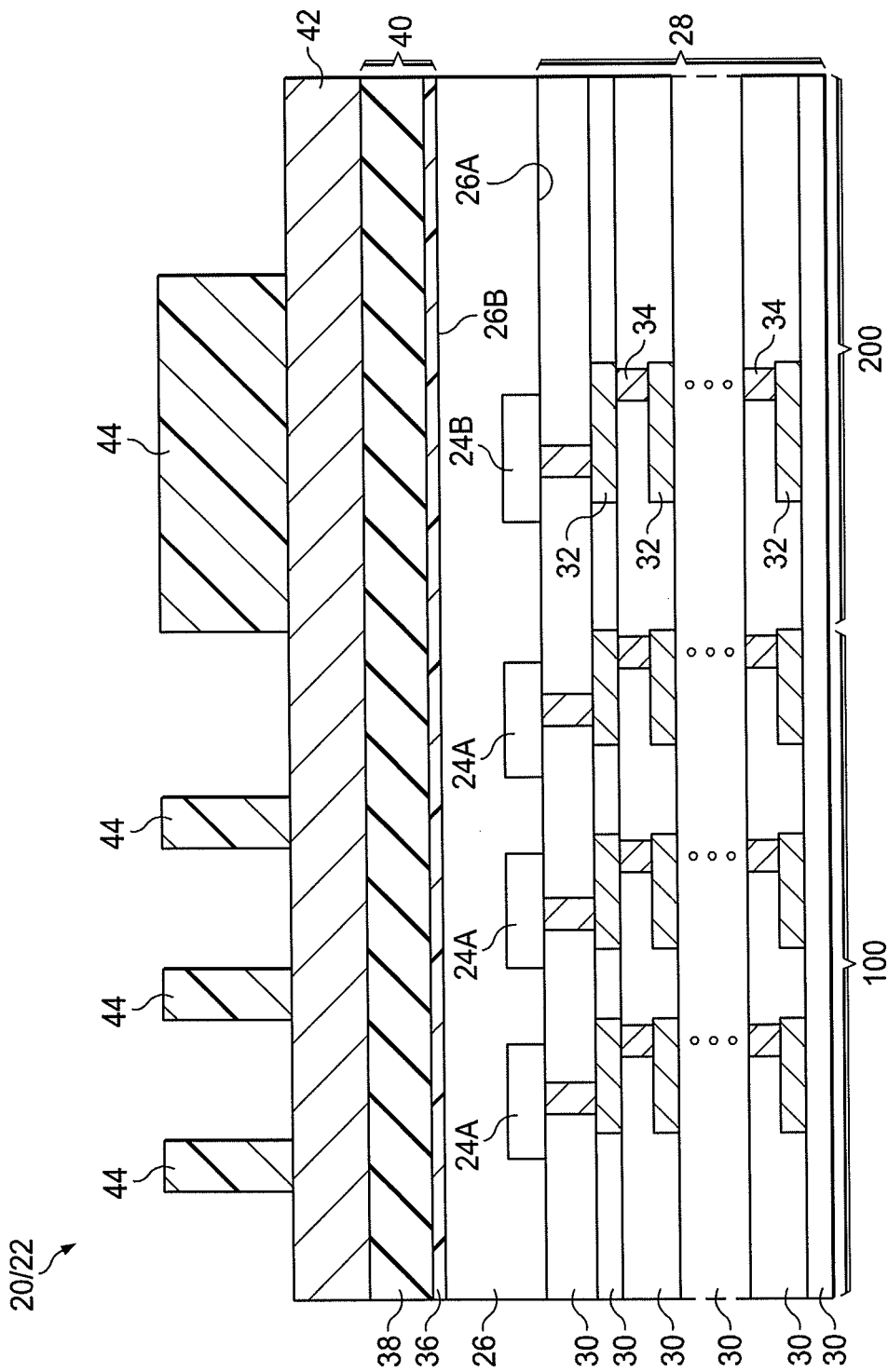
FIGS. 1 through 4 are cross-sectional views of intermediate stages in the manufacturing of a metal shield structure on a backside of a Backside Illumination (BSI) image sensor chip in accordance with exemplary embodiments.

FIGS. 1 through 4 illustrate the cross-sectional views of intermediate stages in the manufacturing of a metal shield in accordance with some exemplary embodiments. FIG. 1 illustrates image sensor chip 20, which may be a part of an unsawed wafer 22. Image sensor chip 20 includes semiconductor substrate 26. Semiconductor substrate 26 may be a crystalline silicon substrate or a semiconductor substrate formed of other semiconductor materials. Throughout the description, surface 26A is referred to a front surface of semiconductor substrate 26, and surface 26B is referred to as a back surface of semiconductor substrate 26. Image sensors 24 (including 24A and 24B) are formed at surface 26A of semiconductor substrate 26. Image sensors 24 are configured to convert light signals (photons) to electrical signals, and may be photo-sensitive Metal-Oxide-Semiconductor (MOS) transistors or photo-sensitive diodes. Accordingly, the respective wafer 22 may be an image sensor wafer. The structures of image sensors 24A and 24B may be identical to each other.

Front-side interconnect structure 28 is formed on the front side of semiconductor substrate 26, and is used to electrically interconnect the devices in image sensor chip 20. Front-side interconnect structure 28 includes dielectric layers 30, and metal lines 32 and vias 34 in dielectric layers 30. Throughout the description, the metal lines 32 in a same dielectric layer 30 are collectively referred to as being a metal layer, and front-side interconnect structure 28 may include a plurality of metal layers. In some exemplary embodiments, dielectric layers 30 include low-k dielectric layers and passivation layers. The low-k dielectric layers have low k values, for example, lower than about 3.0. The passivation layers may be formed of non-low-k dielectric materials having k values greater than 3.9. In some embodiments, the passivation layers include a silicon oxide layer and a silicon nitride layer on the silicon oxide layer.

Image sensor chip 20 includes active image sensor pixel region 100 and shielded region 200. Active image sensor pixel region 100 includes active image sensors 24A formed therein, which are used for generating electrical signals from the sensed light. Image sensors 24A may form an active image sensor pixel array, which includes a plurality of image sensors arranged as rows and columns. Shielded region 200 includes black reference image sensors, which are illustrated as 24B, formed therein. Black reference image sensors 24B are used for generating reference black level signals for calibrating the signals of active image sensors 24A. Furthermore, shielded region 200 may include logic devices (also illustrated as 24B), which include Complementary MOS (CMOS) transistors. The logic devices may be used, for example, to process the electrical signals generated by the image sensors.

A backside grinding is performed to thin semiconductor substrate 26, and the thickness of wafer 22 is reduced to smaller than about 30 μm, or smaller than about 5 μm, for example. With semiconductor substrate 26 having a small thickness, light can penetrate from back surface 26B into semiconductor substrate 26, and reach image sensors 24A.

After the step of thinning, buffer layers 40 are formed on the back surface of semiconductor substrate 26. In some exemplary embodiments, buffer layers 40 include Bottom Anti-Reflective Coating (BARC) 36, and silicon oxide layer 38 over BARC layer 36. It is appreciated that buffer layers 40 may have different structures, formed of different materials, and may have different number of layers other than illustrated. In some embodiments, silicon oxide layer 38 is formed using Plasma Enhanced Chemical Vapor Deposition (PECVD), and hence is referred to as Plasma Enhanced (PE) oxide layer 38.

Metal layer 42 is formed over buffer layers 40. In some embodiments, the metal (or metals) in metal layer 42 include tungsten, aluminum, copper, and/or the like. For example, metal layer 42 may be formed of aluminum copper. The thickness of metal layer 42 may be greater than about 2 kÅ, and may be between about 2 kÅ and about 14 kÅ, for example. It is appreciated that the dimensions recited throughout the description are merely examples, and may be changed to different values. Photo resist 44 is formed over metal layer 42, and is then patterned.

Figure 2:
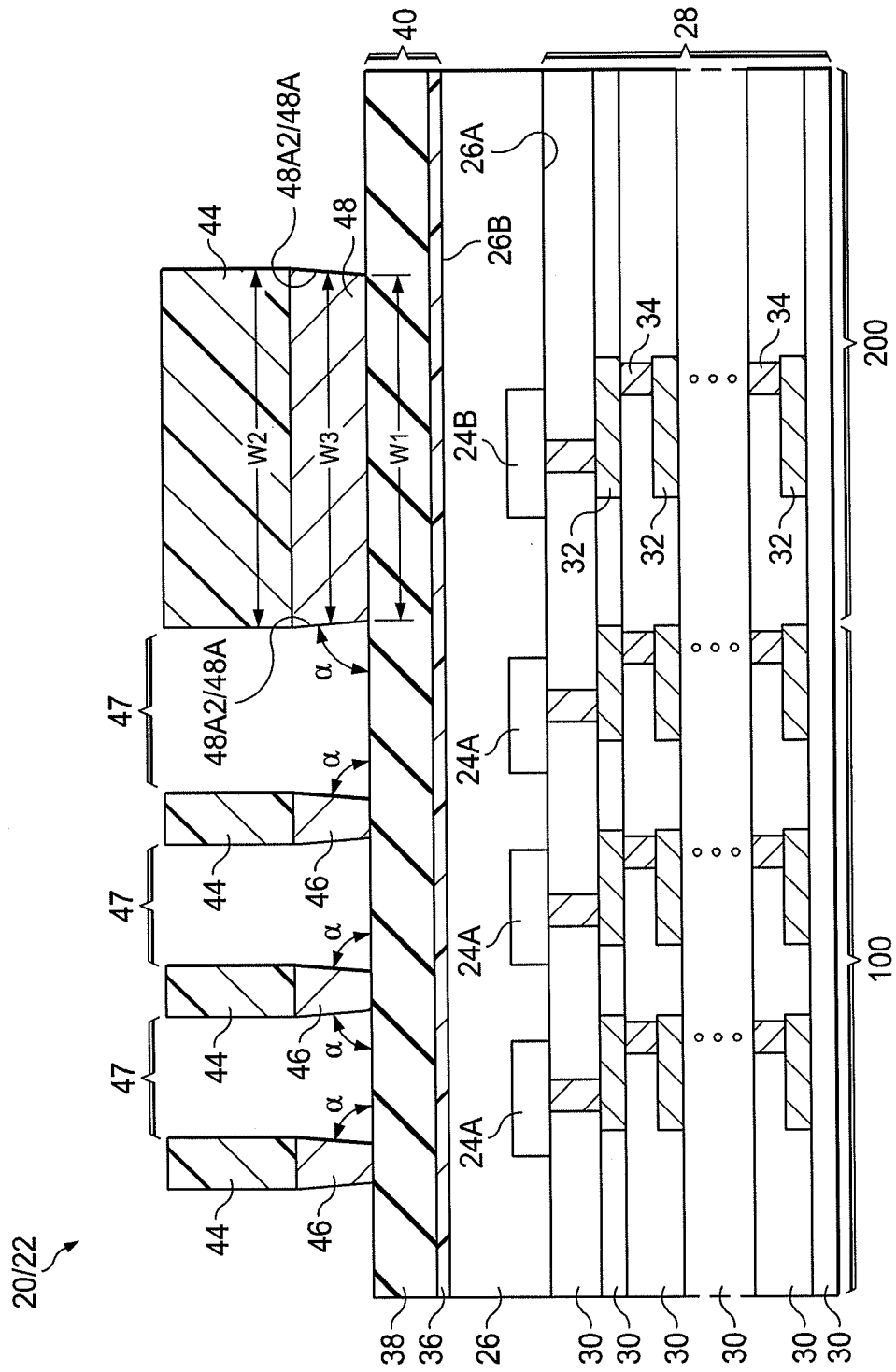
Figure 9:
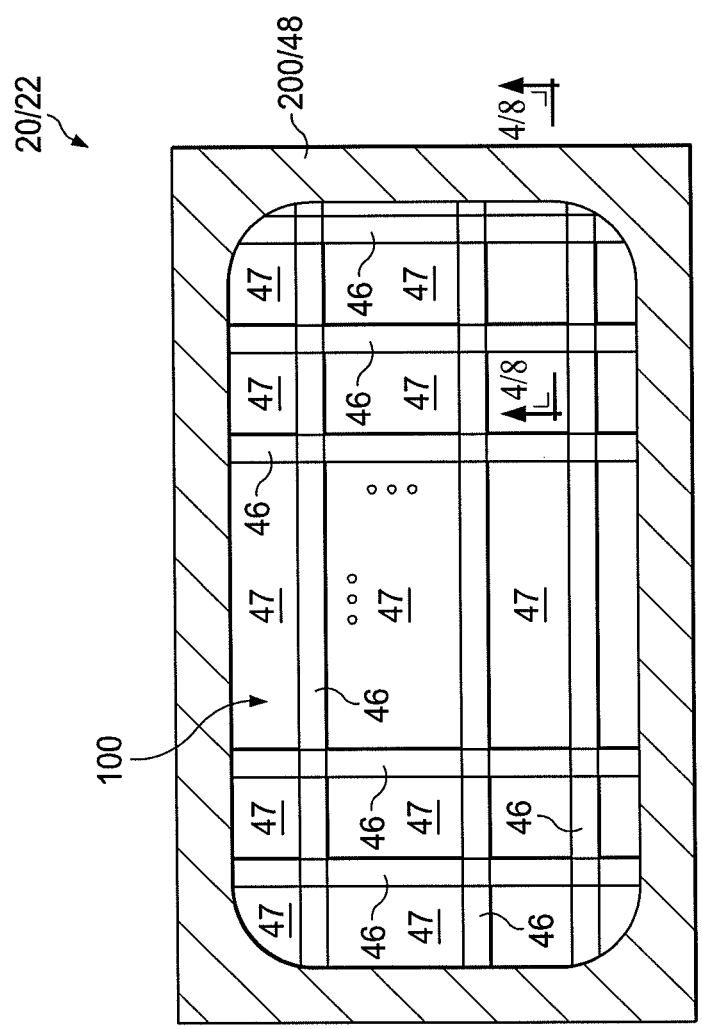
FIG. 9 illustrates a top view of the metal shield structure in the BSI image sensor chip in accordance with some exemplary embodiments.

The patterned photo resist 44 is used as an etching mask to etch through metal layer 42. Referring to FIG. 2, the remaining portions of metal layer 42 forms a metal grid in active image sensor pixel region 100 and metal shield 48 in shielded region 200. The metal grid includes metal grid lines 46. In some embodiments, as illustrated, metal grid lines 46 and metal shield 48 are formed using the same material, and are formed simultaneously. In alternative embodiments, grid lines 46 and metal shield 48 may be formed using different processes, and may comprise different materials. As shown in FIG. 9, metal grid lines 46 include a first plurality of grid lines parallel to each other, and a second plurality of grid lines parallel to each other. The first plurality of grid lines is perpendicular to the second plurality of grid lines 46 to form the grids. Grid openings 47 are formed between grid lines 46. Each of grid openings 47 may be over and aligned to one of active image sensors 24A.

Referring back to FIG. 2, metal shield 48 is formed over and aligned to devices 24B, which may include the black reference image sensors and/or the logic devices. Metal shield 48 is sometimes referred to as an optical shield, which is used to prevent light from being received by devices 24B.

In some embodiments, metal layer 42 comprises aluminum copper. The etching of metal layer 42 may be performed using chlorine ($Cl_2$) and boron chloride ($BCl_3$) as process gases. The flow rate of $BCl_3$ (denoted as F(BCl3) hereinafter) may be relatively high to incur more physical etching, and the flow rate of $Cl_2$ (denoted as F(Cl2) hereinafter) may be relatively low to incur less chemical etching. In some embodiments, the flow rate ratio F(Cl2)/F(BCl3) is in the range between about 1/1 and about 1/10, or in the rage between about 1/5 and about 1/10. In alternative embodiments, flow rate ratio F(Cl2)/F(BCl3) may be higher. During the etching process, plasma is generated from the process gases. It is realized that the optimum etching conditions are related to the composition (such as the elements and the percentage of the elements) of metal layer 42. Depending on the process conditions and the composition of metal layer 42, the flow rate ratio F(Cl2)/F(BCl3) may also be adjusted further to optimize the etch process.

As a result of the adjusted flow rate ratio and possibly some other optimized etching conditions, metal shield 48 may have a reversed trapezoid shape, wherein bottom width W1 is smaller than top width W2. Furthermore, bottom width W1 may also be smaller than middle width W3, which is measured at a middle level of metal layer 42. In some embodiments, edges 48A of metal shield 48 are substantially straight and tilted. Accordingly, the lower portions of edges 48A are recessed from the respective upper portions. The tilt angle α of sidewalls 48A is smaller than 90 degrees, and may be smaller than about 85 degrees. Furthermore, tilt angle α may be between about 45 degrees and about 80 degrees. Edges 48A include inner edge 48A1 that faces active image sensor pixel region 100 and grid lines 46. Edges 48A also include outer edge 48A2 that is opposite inner edge 48A1. When grid lines 46 and metal shield 48 are formed simultaneously, the profiles of the edges of grid lines 46 may be similar to the profile of edges 48A. For example, edges of grid lines 46 may have tilt angles that are close to tilt angle α.

Figure 3:
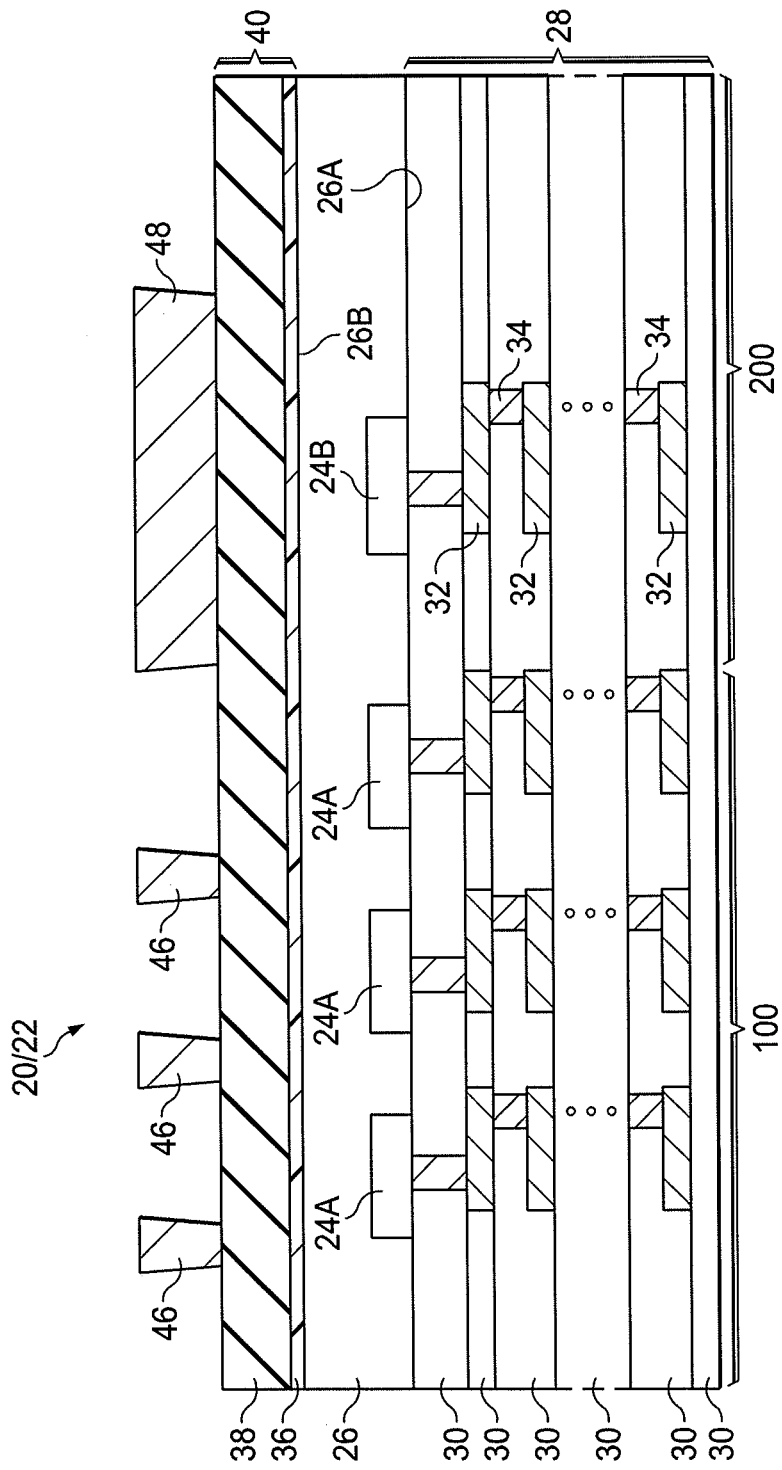
Figure 4:
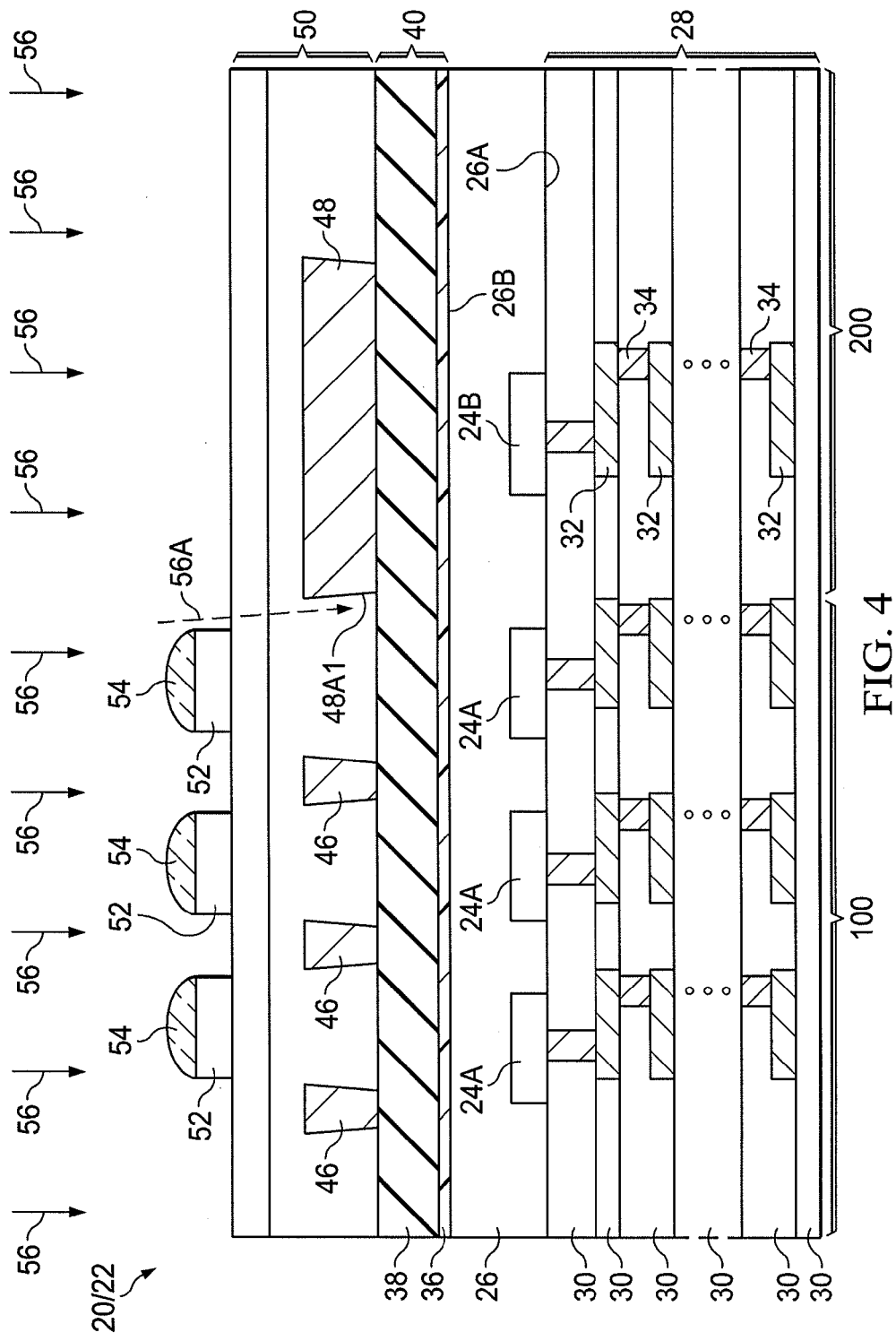

In FIG. 3, photo resist 44 is removed. Next, as shown in FIG. 4, dielectric layers 50 are formed. Dielectric layers 50 may include an oxide layer, which may be a silicon oxide layer formed using PECVD, for example. Dielectric layers 50 may further include a silicon nitride layer over the oxide layer. In some embodiments, a planarization step such as a Chemical Mechanical Polish (CMP) is performed to level the top surface of oxide layers 50. In subsequent process steps, as also shown in FIG. 4, additional components such as color filters 52 and micro-lenses 54 are formed, with each of color filters 52 and micro-lenses 54 aligned to one of active image sensors 24A.

When light 56 is projected to BSI image sensor chip 20 from the backside of substrate 26, light 56 is received by active image sensors 24A. The reverse trapezoid shape of metal shield 48 is used to collect more light for image sensors 24A. For sample, with edge 48A1 facing image sensor pixel region 100, light ray 56A, which is tilted, is not blocked by metal shield 48. The intensity of the light received by image sensors 24A is thus increased.

FIG. 9 illustrates a top view of regions 100 and 200, wherein metal shield 48 is formed in shielded region 200, and may form a ring encircling region 100 and grid lines 46 in some embodiments. The cross-sectional view shown in FIG. 4 may be obtained from the plane crossing line 4/8-4/8 in FIG. 9.

FIGS. 5 through 8 illustrate cross-sectional views of intermediate stages in the formation of a metal shield in accordance with alternative embodiments. Unless specified otherwise, the materials and formation methods of the components in these embodiments are essentially the same as the like components, which are denoted by like reference numerals in the embodiments shown in FIGS. 1 through 4. The details of the like components shown in FIGS. 5 through 8 may thus be found in the discussion of the embodiments shown in FIGS. 1 through 4.

Figure 5:
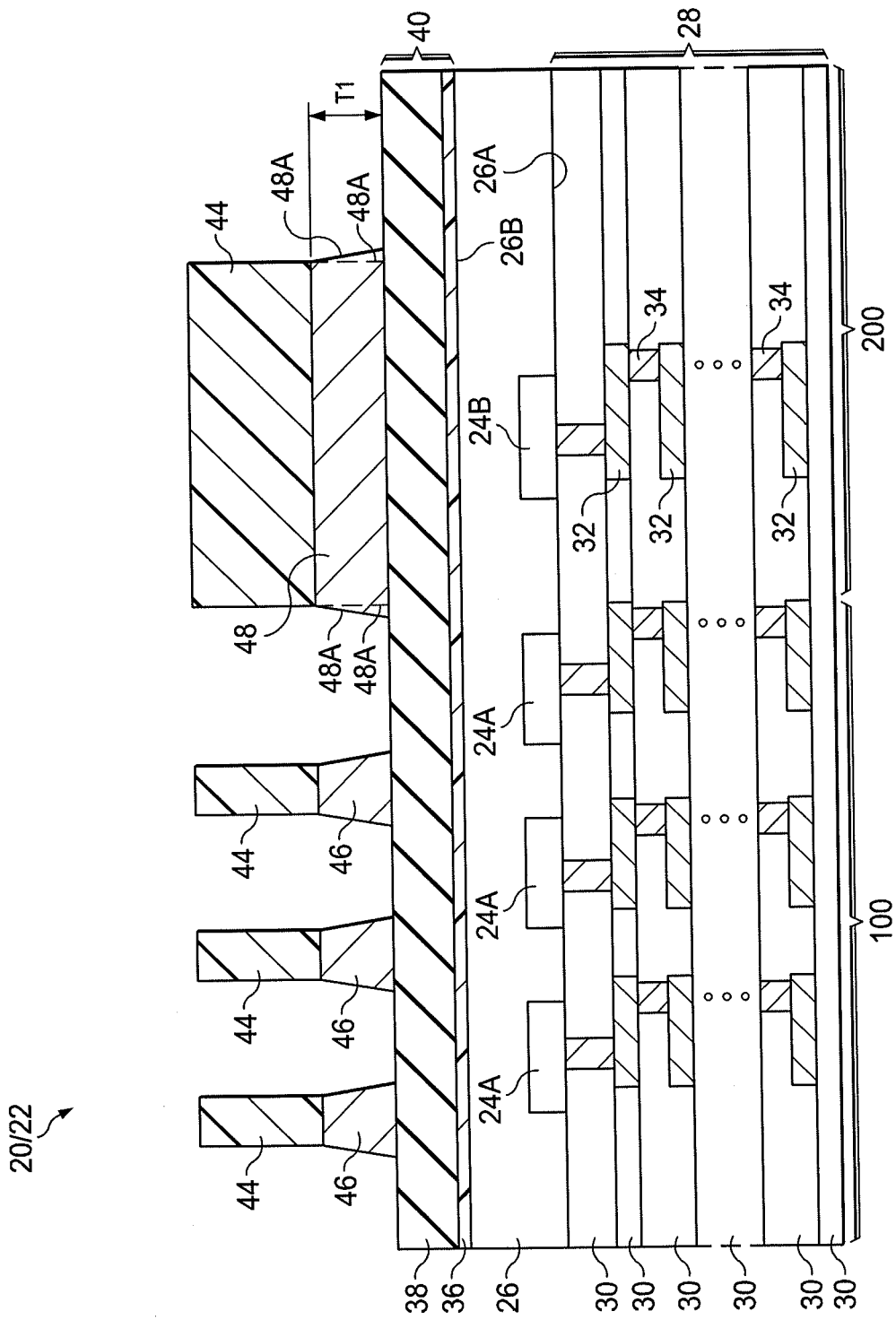
FIGS. 5 through 8 are cross-sectional views of intermediate stages in the manufacturing of a metal shield structure on a backside of a BSI image sensor chip in accordance with alternative exemplary embodiments.

The initial steps of these embodiments are essentially the same as shown in FIG. 1. After the structure as in FIG. 1 is formed, metal layer 42 is etched, and the resulting structure is shown in FIG. 5. In some embodiments, the etching of metal layer 42 is performed using $Cl_2$ and $BCl_3$ as process gases. During the etch step, plasma is generated from the process gases. In some embodiments, the flow rate ratio F(Cl2)/F(BCl3) may be lower than about 1/1, for example, although a higher flow rate ratio may also be used. Depending on the composition of metal layer 42, the flow rate ratio F(Cl2)/F(BCl3) may also be adjusted to have different values. The resulting metal shield 48 may have a trapezoid shape, wherein the bottom width of metal shield 48 is greater than the respective top width. Alternatively, metal shield 48 may have substantially vertical edges 48A (schematically illustrated using dashed lines), and the bottom width of metal shield 48 is substantially equal to the top width of metal shield 48. Edges 48A of metal shield 48 may be substantially straight.

During the etching of metal layer 42, the end point is monitored to determine when metal layer 42 is etched through. At a time metal layer 42 is already etched through, metal shield 48 may have the edge profile similar to what is shown in FIG. 5. When the end point is detected, wherein metal layer 42 is etched through, and the underlying layer is exposed, the etching step is continued, and an over-etch is performed. In some embodiments, the over-etch is performed using. In some embodiments, the over-etch may have the duration between about 5 seconds and about 15 seconds, depending on thickness T1 of metal layer 42 shield 48.

Figure 6:
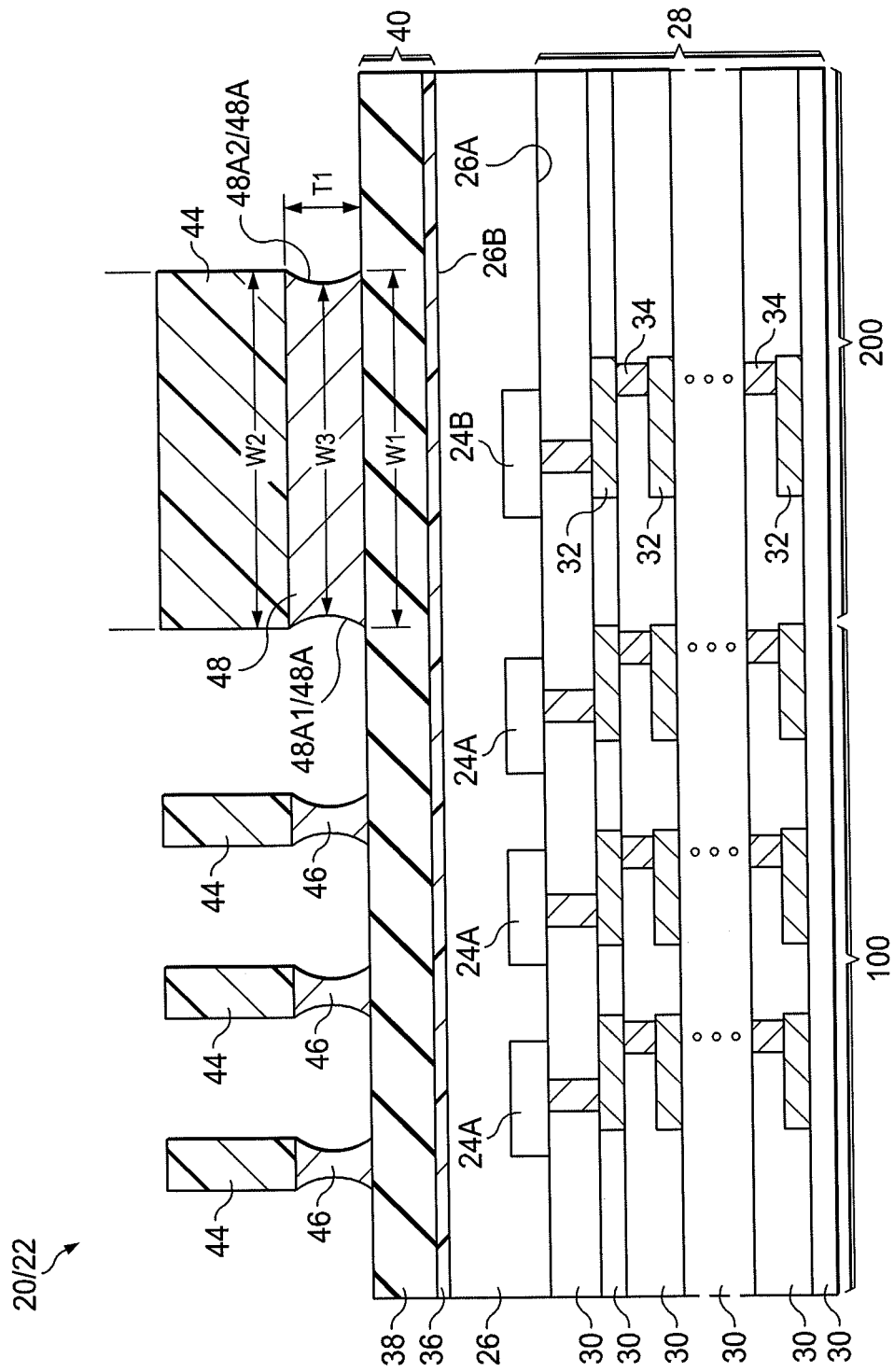

The resulting profile of metal shield 48 is related to the duration of the over-etch. Referring to FIG. 6, the over-etch is performed long enough to result in edges 48A of metal shield 48 to have a concave arc profile. With the concave arc profile, the middle portions of metal shield 48 are recessed more than the top and bottom portions of metal shield 48. Furthermore, the middle portions of edges 48A are recessed from the respective top portions and bottom portions. Middle width W3 of metal shield 48 is smaller than bottom width W1 and top width W2. Edges 48A may also include smoothly transitioned arc portions. In some embodiments, width difference (W1−W3) is greater than about 0.25*T1, wherein T1 is the thickness of metal shield 48. Width difference (W1−W3) may also be greater than about 1 kÅ, for example, when thickness T1 is about 4 kÅ. Width difference (W1−W3) may also be greater than about 0.25*T1. Width difference (W1−W3) may also be greater than about 1 kÅ, for example, when thickness T1 is about 4 kÅ. Width difference (W1−W3) may also be greater than about 2 kÅ. Furthermore, top width W2 may also be smaller than width W1, with both widths W1 and W2 being greater than width W3. Width difference (W2−W3) may also be greater than about 1 kÅ or 2 kÅ.

In accordance with alternative embodiments, after the etching step as shown in FIG. 5 is performed, and the end point is detected, an over-etch is performed using process conditions that are different from the process conditions for etching through metal layer 42. In some exemplary embodiments, during the over-etch, the plasma is turned off. The flow of $BCl_3$ is substantially turned off. $Cl_2$ is still used to further etch metal shield 48. In some embodiments, during the over-etch, the etching temperature may be between about 55° C. and about 75° C., the flow rate of $Cl_2$ may be between about 60 sccm and about 270 sccm. The duration of the over-etch may be between about 5 seconds and about 20 seconds. In the embodiments shown in FIG. 6, since grid lines 46 and metal shield 48 are formed simultaneously, the edges of grid lines 46 may also have concave arc profiles.

Figure 7:
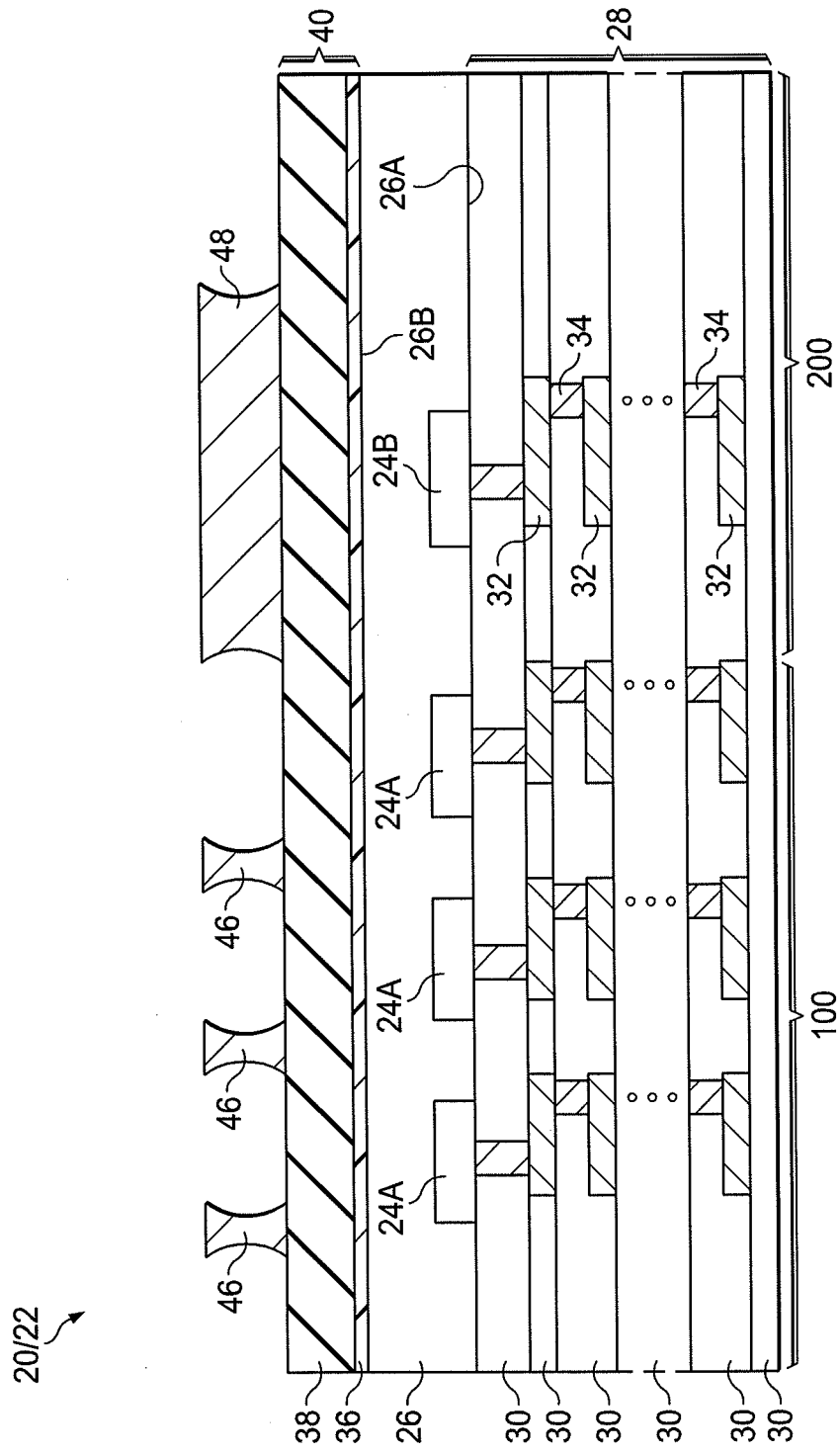
Figure 8:
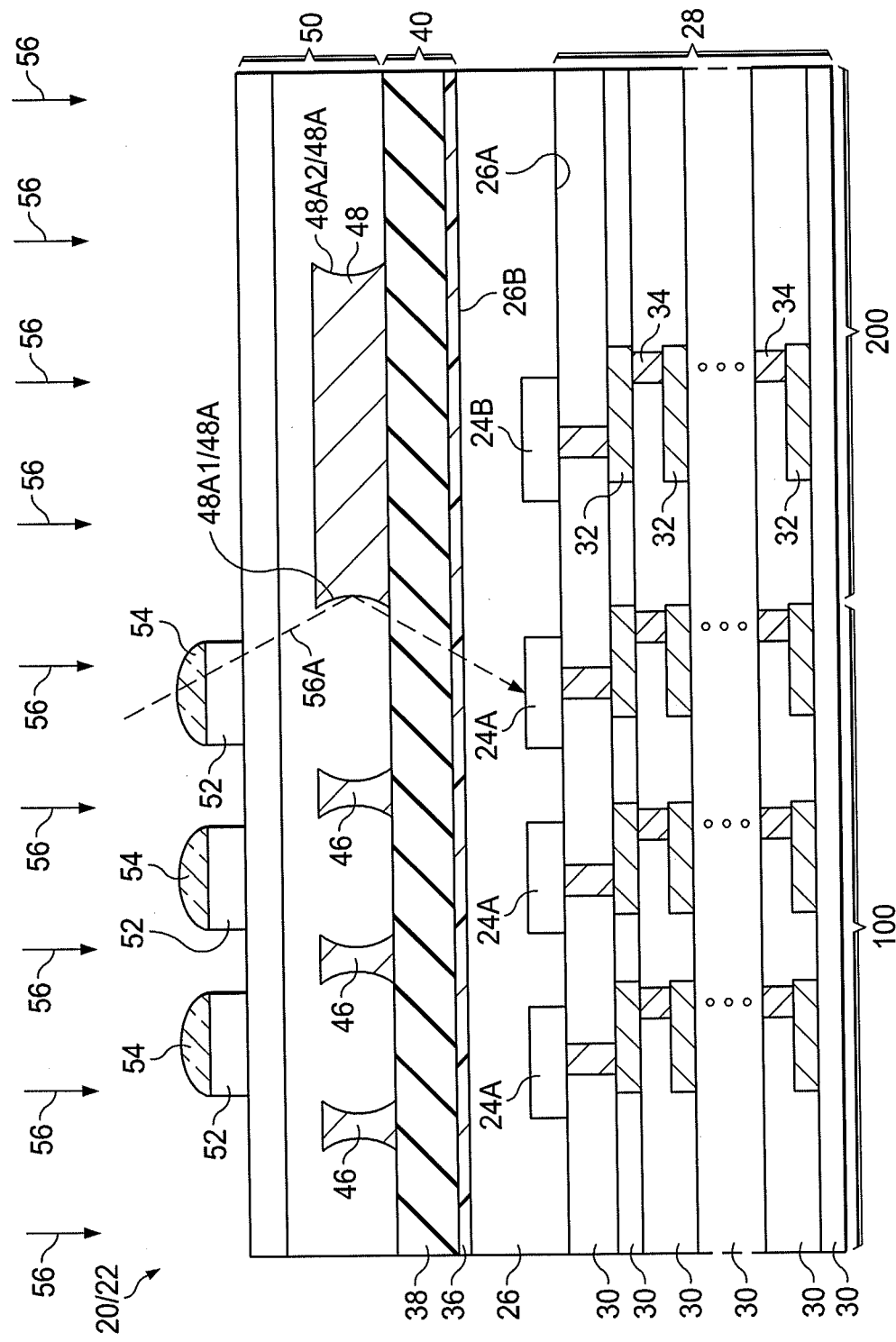

Referring to FIG. 7, photo resist 44 is removed, for example, through an ashing process. Next, as shown in FIG. 8, dielectric layers 50, color filters 52, and micro-lenses 54 are formed. Each of color filters 52 and micro-lenses 54 is aligned to one of active image sensors 24A. The top views of regions 100 and 200, grid lines 46, and metal shield 48 is also illustrated in FIG. 9, wherein the cross-sectional view shown in FIG. 8 is obtained from the plane crossing line 4/8-4/8 in FIG. 9.

Referring back to FIG. 8, when light 56 is projected to BSI image sensor chip 20, light 56 is received by active image sensors 24A from the backside of substrate 26. The concave arc shape of metal shield 48 is used to reflect more light to active image sensors 24A. For sample, edge 48A1, which is the edge of metal shield 48 facing image sensor pixel region 100, may reflect light ray 56A to image sensors 24A. The intensity of the light received by active image sensors 24A is thus increased.

In accordance with embodiments, a device includes a semiconductor substrate having a front side and a backside. An active image sensor pixel array is disposed on the front side of the semiconductor substrate. A metal shield is disposed on the backside of, and overlying, the semiconductor substrate. The metal shield has an edge facing the active image sensor pixel array. The metal shield has a middle width, and a top width greater than the middle width.

In accordance with other embodiments, a device includes a semiconductor substrate having a front side and a backside, a metal grid on the backside of the semiconductor substrate, and a plurality of photo-sensitive devices underlying and aligned to grid openings of the metal grid. The plurality of photo-sensitive devices is at the front side of the semiconductor substrate, and is configured to receive light from the backside of the semiconductor substrate and convert the light to electrical signals. A metal shield is disposed on the backside of, and overlying, the semiconductor substrate. The metal shield forms a ring encircling the metal grid, and an inner edge of the metal shield facing the metal grid is tilted, with a middle portion of the edge recessed from a respective top portion.

In accordance with yet other embodiments, a method includes forming a plurality of photo-sensitive devices on a front side of a semiconductor substrate, and forming a metal layer on a backside of the semiconductor substrate. The metal layer is over the semiconductor substrate. The method further includes etching the metal layer to form a metal shield that has an edge facing the active image sensor pixel array, wherein the metal shield has a middle width, and a top width greater than the middle width.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a semiconductor substrate having a front side and a backside;
   a plurality of metal layers on the front side of the semiconductor substrate;
   an active image sensor pixel array disposed on the front side of the semiconductor substrate; and
   a metal shield on the backside of, and overlying, the semiconductor substrate, wherein the metal shield has an edge facing the active image sensor pixel array, and wherein the metal shield has a middle width, and a top width greater than the middle width.

2. The device of claim 1, wherein the metal shield has a reverse trapezoid shape, and wherein a bottom width of the metal shield is smaller than the middle width and the top width.

3. The device of claim 2, wherein the edge of the metal shield is substantially straight, and wherein a tilt angle of the edge is between about 45 degrees and about 80 degrees.

4. The device of claim 1, wherein the metal shield has a concave arc shape, and wherein a bottom width of the metal shield is greater than the middle width.

5. The device of claim 4, wherein a difference between the top width and the middle width is greater than about 2 kÅ.

6. The device of claim 1 further comprising metal grid lines overlying the active image sensor pixel array, wherein metal grid lines form a metal grid, with grid openings of the metal grid aligned to image sensors in the active image sensor pixel array, and wherein each of the metal grid lines has an additional middle width, and an additional top width greater than the additional middle width.

7. The device of claim 6, wherein the metal grid lines and the metal shied have top surfaces substantially coplanar with each other, and bottom surfaces substantially coplanar with each other.

8. The device of claim 1 further comprising an active device on the front side of the semiconductor substrate, wherein the metal shield overlaps the active device, and wherein the active device is selected from the group consisting essentially of a photo diode, a transistor, and combinations thereof.

9. A device comprising:
a semiconductor substrate having a front side and a backside;
a plurality of metal layers on the front side of the semiconductor substrate;
a metal grid on the backside of the semiconductor substrate;
a plurality of photo-sensitive devices underlying and aligned to grid openings of the metal grid, wherein the plurality of photo-sensitive devices is at the front side of the semiconductor substrate, and is configured to receive light from the backside of the semiconductor substrate and convert the light to electrical signals; and
a metal shield on the backside of, and overlying, the semiconductor substrate, wherein the metal shield forms a ring encircling the metal grid, and wherein an inner edge of the metal shield facing the metal grid is tilted, with a middle portion of the edge recessed from a respective top portion.

10. The device of claim 9, wherein the inner edge is substantially straight, and wherein a tilt angle of the inner edge is smaller than about 80 degrees.

11. The device of claim 10, wherein the tilt angle is between about 45 degrees and about 80 degrees.

12. The device of claim 9, wherein the metal shield further comprises an outer edge opposite the inner edge, wherein the outer edge is titled, and wherein the metal shield has a top width, and a bottom width smaller than the top width, with the top width and the bottom width measured between the inner edge and the outer edge.

13. The device of claim 12, wherein the metal shield has a concave arc shape, and wherein a bottom width of the metal shield is greater than a middle width of the metal shield.

14. The device of claim 9, wherein grid openings of the metal grid are aligned to image sensors in the plurality of photo-sensitive devices, wherein the metal grid comprises metal grid lines, and wherein each of metal grid lines has an additional middle width, and an additional top width greater than the additional middle width.

15. The device of claim 9, wherein the metal grid and the metal shield are formed of a same metallic material, and wherein the metal grid and the metal shied have top surfaces substantially coplanar with each other, and bottom surfaces substantially coplanar with each other.

16. A device comprising:
a semiconductor substrate having a front side and a backside;
a plurality of metal layers on the front side of the semiconductor substrate;
a metal grid on the backside of, and over, the semiconductor substrate;
a plurality of photo-sensitive devices underlying and aligned to grid openings of the metal grid; and
a metal shield on the backside of, and overlying, the semiconductor substrate, wherein the metal grid and the metal shied have top surfaces substantially coplanar with each other, and bottom surfaces substantially coplanar with each other, and wherein from a top surface to a bottom surface of the metal shield, widths of the metal shield continuously reduce.

17. The device of claim 16, wherein an inner edge of the metal shield facing the metal grid is substantially straight in a cross-sectional view of the metal shield.

18. The device of claim 17, wherein the inner edge of the metal shield is tilted, with a middle portion and a bottom portion of the edge recessed from a respective top portion of the metal shield.

19. The device of claim 17, wherein a tilt angle of the inner edge is smaller than about 80 degrees.

20. The device of claim 17, wherein the metal shield comprises aluminum copper.

* * * * *

UNITED STATES PATENT AND TRADEMARK OFFICE
CERTIFICATE OF CORRECTION

PATENT NO.          : 8,698,217 B2                                Page 1 of 1
APPLICATION NO.     : 13/428904
DATED               : April 15, 2014
INVENTOR(S)         : Chun-Yuan Hsu It is certified that error appears in the above-identified patent and that said Letters Patent is hereby corrected as shown below:

In the Claims

In Col. 6, line 65, claim 7, delete "shied" and insert --shield--.
In Col. 8, line 9, claim 15, delete "shied" and insert --shield--.
In Col. 8, line 23, claim 16, delete "shied" and insert --shield--.

Signed and Sealed this
First Day of July, 2014

Michelle K. Lee
*Deputy Director of the United States Patent and Trademark Office*